United States Patent

Whybrew et al.

[11] Patent Number: 6,130,585
[45] Date of Patent: Oct. 10, 2000

[54] CROSS-OVER DISTRIBUTION SCHEME FOR CANCELING MUTUALLY COUPLED SIGNALS BETWEEN ADJACENT STRIPLINE SIGNAL DISTRIBUTION NETWORKS

[75] Inventors: Walter M. Whybrew, Palm Bay; Jeffery C. May; Douglas E. Heckaman, both of Indialantic, all of Fla.

[73] Assignee: Harris Corporation, Melbourne, Fla.

[21] Appl. No.: 09/010,655

[22] Filed: Jan. 22, 1998

[51] Int. Cl.[7] .................................. H01P 3/08; H01P 5/12
[52] U.S. Cl. ........................ 333/1; 333/128; 333/136; 333/246
[58] Field of Search .............................. 333/1, 238, 246, 333/128, 136

[56] References Cited

U.S. PATENT DOCUMENTS

| | | |
|---|---|---|
| 3,095,549 | 6/1963 | Butler ........................................ 333/246 |
| 4,583,061 | 4/1986 | O'Shea ................................. 333/128 X |
| 5,003,273 | 3/1991 | Oppenberg ................................... 333/1 |
| 5,021,755 | 6/1991 | Gustafson ................................. 333/128 |
| 5,153,602 | 10/1992 | DuBois et al. .......................... 343/853 |
| 5,296,651 | 3/1994 | Gurrie et al. ............................ 174/254 |
| 5,600,285 | 2/1997 | Sachs et al. ................................. 333/1 |

*Primary Examiner*—Benny Lee
*Attorney, Agent, or Firm*—Charles E. Wands

[57] ABSTRACT

A stripline cross-over architecture includes a first stripline layer extending on a first side of a dielectric layer between a first signal input port and a plurality of first signal output ports. A second stripline layer extends on a second side of the dielectric layer between a second signal input port and a plurality of second signal output ports, crossing over the first stripline layer at a plurality of cross-overs of mutual overlap therebetween. The electrical lengths of the stripline layers are defined and the cross-overs are located such that electrical distances between the cross-overs and signal combination locations cause cross-coupled signals to cancel one another, when non cross-coupled signals are combined in phase.

11 Claims, 4 Drawing Sheets

CROSS-OVER DISTRIBUTION SCHEME FOR CANCELING MUTUALLY COUPLED SIGNALS BETWEEN ADJACENT STRIPLINE SIGNAL DISTRIBUTION NETWORKS

FIELD OF THE INVENTION

The present invention relates in general to communication systems, and is particularly directed to a new and improved scheme for defining the geometry of and locating the cross-over points of overlapping stripline sections of a multilayer signal distribution architecture, so that unwanted coupled signals eventually cancel one another, when the desired signals are combined in phase, thereby effectively preventing mutual interference between the adjacent layers of stripline.

BACKGROUND OF THE INVENTION

Modular communication systems, such as those used in spaceborne and airborne applications, typically employ highly compact and densified signal distribution/feed networks, such as multilayer stripline networks, to interconnect various components, such as RF signal processing (amplifier and impedance/phase control) circuits and beam-forming circuits for a phased array antenna. To minimize size and weight, it is common practice to stack multiple ones of such microstrip or stripline configured signal distribution networks as closely together as possible in a common support structure, such as in a laminated arrangement of printed circuits. A simplified illustration of such a laminated structure is diagrammatically illustrated in FIGS. 1 and 2 as patterns of conductors 1 and 2 and intermediate dielectric layers 3 (see FIG. 1), that are stacked together to form a three dimensional signal distribution architecture.

Because high frequency signal distribution networks, such as those employed for (RF) signalling applications in the hundreds of MHz or into the high GHz range, readily couple (radiate and receive) substantial electromagnetic energy in addition to that which is transmitted through the conductors of the networks, it is necessary to carefully configure and/or space such networks with respect to one another and adjacent system components. In FIGS. 1 and 2, this internal separation is shown by a horizontal spacing 4 and a vertical spacing corresponding to the thickness of an intermediate dielectric layer 3 between respective conductors 1 and 2. As far as the environment outside the network is concerned, the signal coupling problem is addressed by the use of (grounded) shielding layers, shown at 5 and 6 in FIG. 1.

However, within the multilayer structure itself, it can be expected that conductors of the respective networks will cross over or overlap one another at one or more locations, one of which is shown at 7 in FIG. 2. Because of the relatively reduced vertical separation between the conductors of the respective layers of the laminate, unwanted mutual coupling or cross-talk between the networks will occur at these cross-over points. A customary practice to solve this problem, diagrammatically illustrated in FIG. 3, is to insert a (copper) shielding layer 8 between each signal distribution layer. The shielding layer 8 is separated by dielectric layers 3 from conductor layers 1 and 2. On the top and bottom of the laminate are respective grounded shielding layers 5 and 6, lying atop respective dielectric layers 3.

Unfortunately, this not only adds to the weight of each intermediate metal layer, but substantially increases the overall thickness of the laminate, as additional dielectric layers 3 must be interposed between each shielding copper layer and a respective stripline layer. Moreover, the desire to keep such a laminate structure as thin as possible is countered by a trade-off between the thickness of the dielectric between the stripline and the ground layer and the lossiness of the stripline. Namely, because the effective impedance of the stripline is dependent upon its proximity to a ground layer, the thinner the dielectric, the narrower the line width of the stripline must be, in order to maintain a desired characteristic line impedance (e.g., fifty ohms, nominal). However, reducing the cross-section of the stripline increases its resistance and therefore its lossiness.

SUMMARY OF THE INVENTION

Pursuant to the invention, the above-described cross-talk problem is successfully addressed by defining the geometry of, and locating each of the points at which mutually overlapping adjacent stripline networks cross one another, so that unwanted (cross-coupled) signals will eventually cancel one another, when the desired signals are combined in phase, thereby effectively preventing mutual interference between adjacent layers of stripline. This a priori locating of the stripline cross-over points is particularly beneficial in a multilayer signal architecture configured to distribute signals with respect to elements of adjacent phased array antennas, as it obviates the need for an intermediate grounded shielding layer and associated dielectric layer between adjacent signal distribution networks, thereby reducing the size, weight and cost of the laminate architecture.

For the case of a dual layer architecture, a first signal distribution network may comprise a layer of stripline, such as a layer of fifty-ohm copper transmission line, containing one or more power dividers patterned on a first side of a first dielectric layer. A second signal distribution network may comprise a second layer of stripline containing one or more power dividers patterned on a second, opposite side of the dielectric layer. When overlaid atop one another, one or more regions of the two patterned stripline networks will cross-over or mutually overlap each other, between the signal input port and the multiple signal output ports of each distribution network.

In accordance with the invention, the geometries of the two stripline layers are defined, so that wherever stripline sections of adjacent layers overlap or cross, they are oriented at right angles to one another, thereby minimizing the area of mutual coupling of one section of stripline to another. Secondly, the cross-overs are placed such that the electrical distances between the cross-overs and downstream combination locations cause unwanted (cross-coupled) signals to cancel one another, when the desired (non cross-coupled) signals are combined in phase.

DETAILED DESCRIPTION OF THE PREFERRED EMBODIMENT

As described above, the stripline cross-over location scheme of the present invention allows two or more signal distribution networks, such as spaced apart layers of patterned stripline, to be supported in mutual overlapping relationship in a compact laminate structure, without having to provide a respective grounded shielding layer between each adjacent network. For purposes of reducing the complexity of the drawings, a two network signal distribution architecture will be described as a non-limiting example. It is to be understood, however, that the invention is not limited to use with this or any particular number of signal distribution networks that may be arranged or stacked in mutually overlapping relationship within a multilayer architecture.

Figure 1:
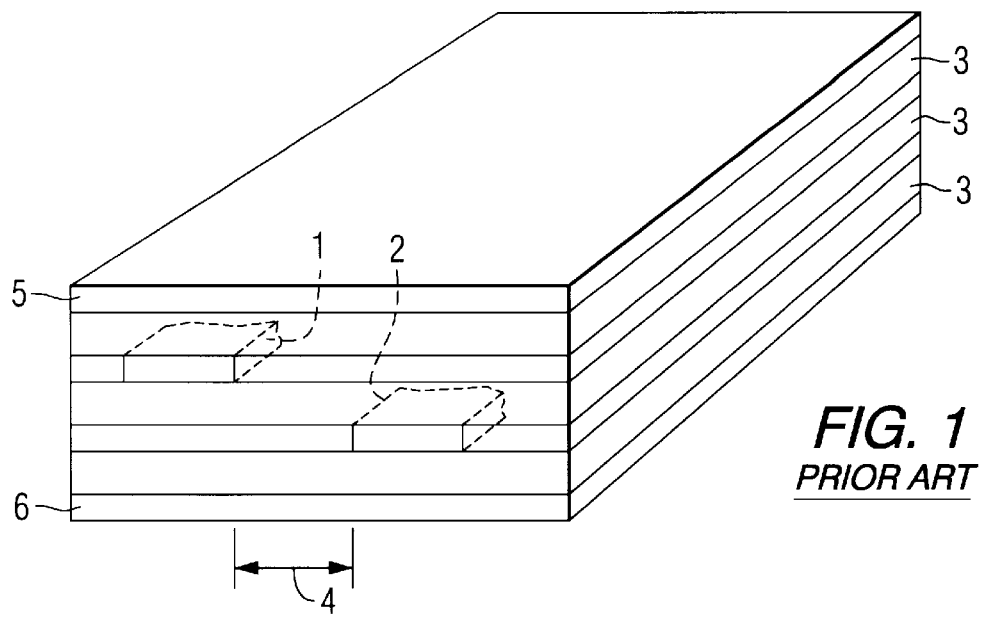
FIGS. 1 and 2 are simplified diagrammatic perspective and plan illustrations of a conventional multilayer signal distribution architecture containing overlapping stripline layers.
Figure 2:
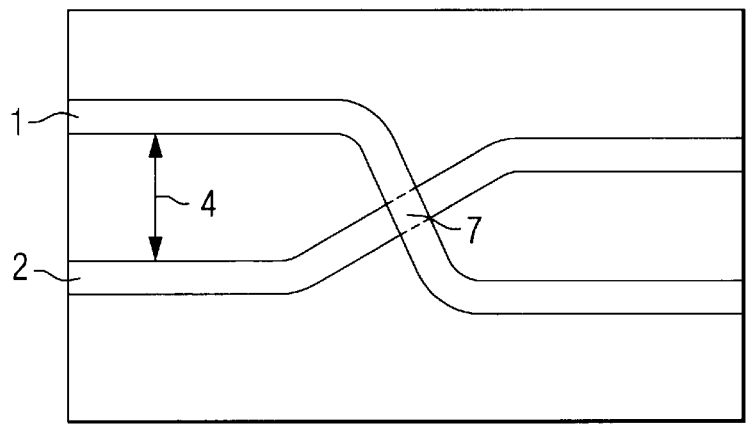
Figure 3:
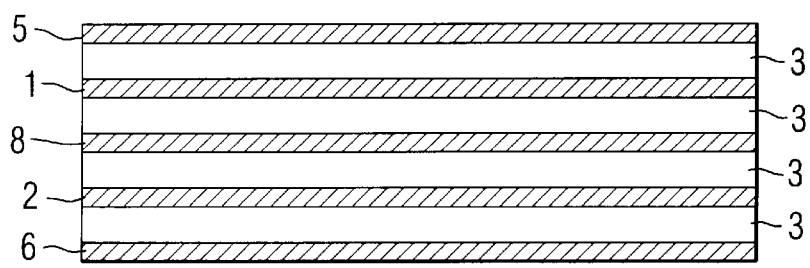
FIG. 3 is a diagrammatic side view of a conventional multilayer signal distribution architecture having a conductive shielding layer between adjacent stripline layers.
Figure 4:
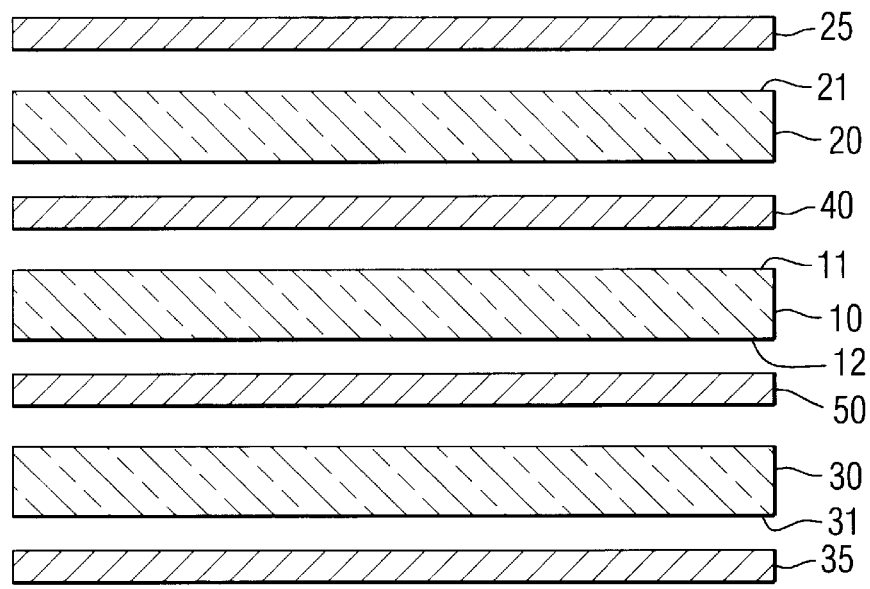
FIG. 4 is a diagrammatic exploded side view of a multilayer signal distribution architecture employing the stripline cross-over location scheme of the present invention.

FIG. 4 is a diagrammatic exploded side view of a multilayer laminate architecture employing the stripline cross-over location scheme of the present invention, in which generally parallel, and overlapping signal distribution networks, such as those used to feed the respective elements of a pair of phased array antennas, are supported in spaced apart relationship by a dielectric layer therebetween. For this purpose, the multilayer architecture has a first, relatively central or intermediate dielectric layer 10, and second and third dielectric layers 20 and 30, that are respectively disposed on first and second (opposite) sides 11 and 12 of the intermediate dielectric layer 10.

A first signal distribution network 40 comprises a patterned layer of stripline, such as a layer of fifty-ohm copper transmission line, formed on the first side 11 of the first dielectric layer 10. Similarly, a second signal distribution network 50 comprises a second stripline layer patterned on the second side 12 of the dielectric layer 10, such that one or more regions of the two stripline networks 40 and 50 mutually overlap each other, as they traverse their way along opposite surfaces 11 and 12 of the dielectric layer 10 from signal input ports to multiple signal output ports of each network.

To complete the stripline laminate architecture, a first shielding ground layer 25, such as a layer of copper, is ubiquitously formed on the outer surface 21 of the second dielectric layer 20, and a second shielding ground layer 35 is similarly formed on the outer surface 31 of the third dielectric layer 30. These two ground-coupled shielding layers 25 and 35 provide ground return and electrical (EMI) isolation between the signal distribution networks of the laminate architecture and the external environment.

Figure 5:
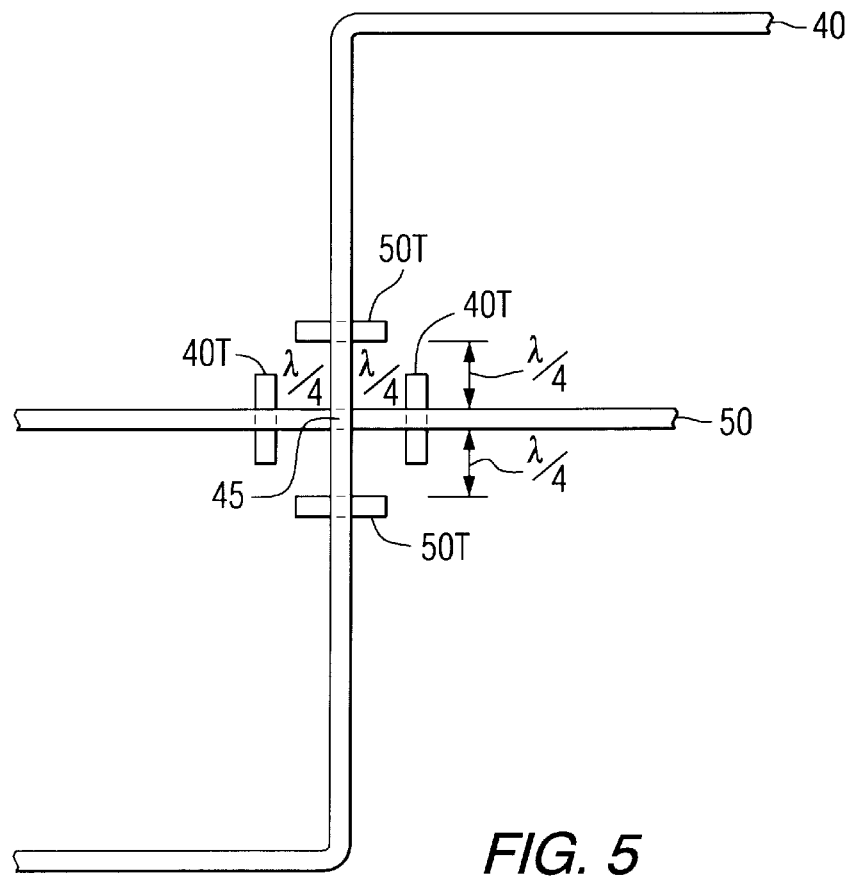
FIG. 5 is a diagrammatic plankview of a multilayer signal distribution architecture employing the stripline cross-over location scheme of the present invention.

As pointed out above, the geometries of the stripline layers of the two distribution networks 40 and 50 are defined such that at regions of mutual overlap, the stripline layers are arranged so that they are spatially oriented at right angles to one another, as shown at a cross-over region 45 in the plan view of FIG. 5. This orthogonal cross-over relationship serves to minimize the area of mutual coupling of one section of stripline to another. In addition, parallel tuning stubs 40T and 50T may be provided at quarter wavelength (θ/4) spacings from the cross-over region 45, as shown.

Moreover, the patterning of each network is defined so as to place the cross-over points at prescribed electrical distances from downstream signal combination locations. Specifically, each cross-over point encountered by a respective stripline layer is located such that the electrical distance to a downstream signal combination location will cause unwanted signals that have been mutually coupled to that stripline layer to effectively cancel one another, when the desired signals through the layer are combined in phase.

Figure 6:
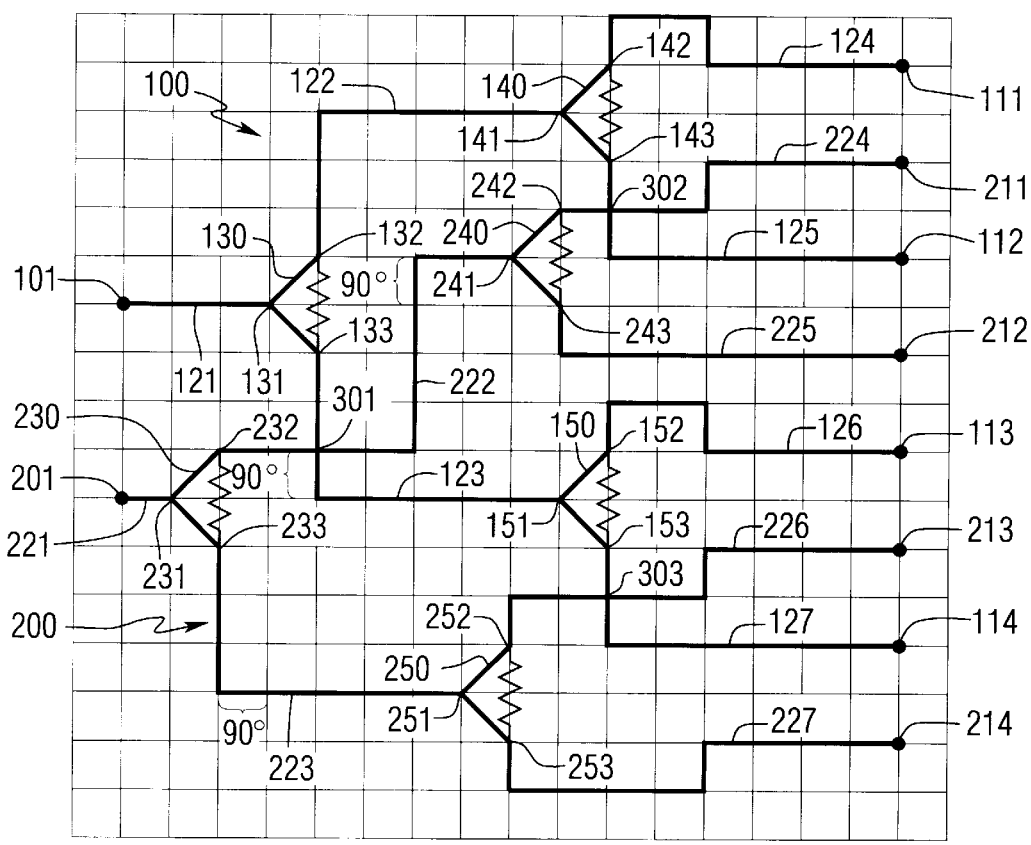
FIG. 6 is a diagrammatic plan view showing a pair of mutually overlapping four-way power dividers, shown individually in plan views of FIGS. 7 and 8.
Figure 7:
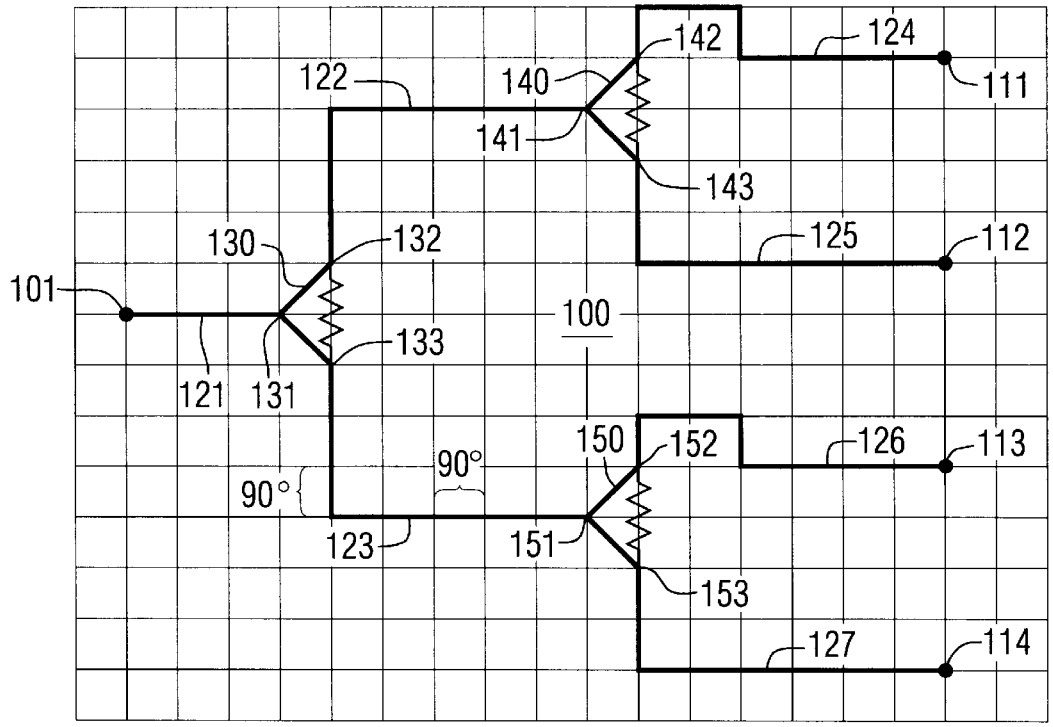
FIG. 7 is a diagrammatic plan view of a four-way power divider.
Figure 8:
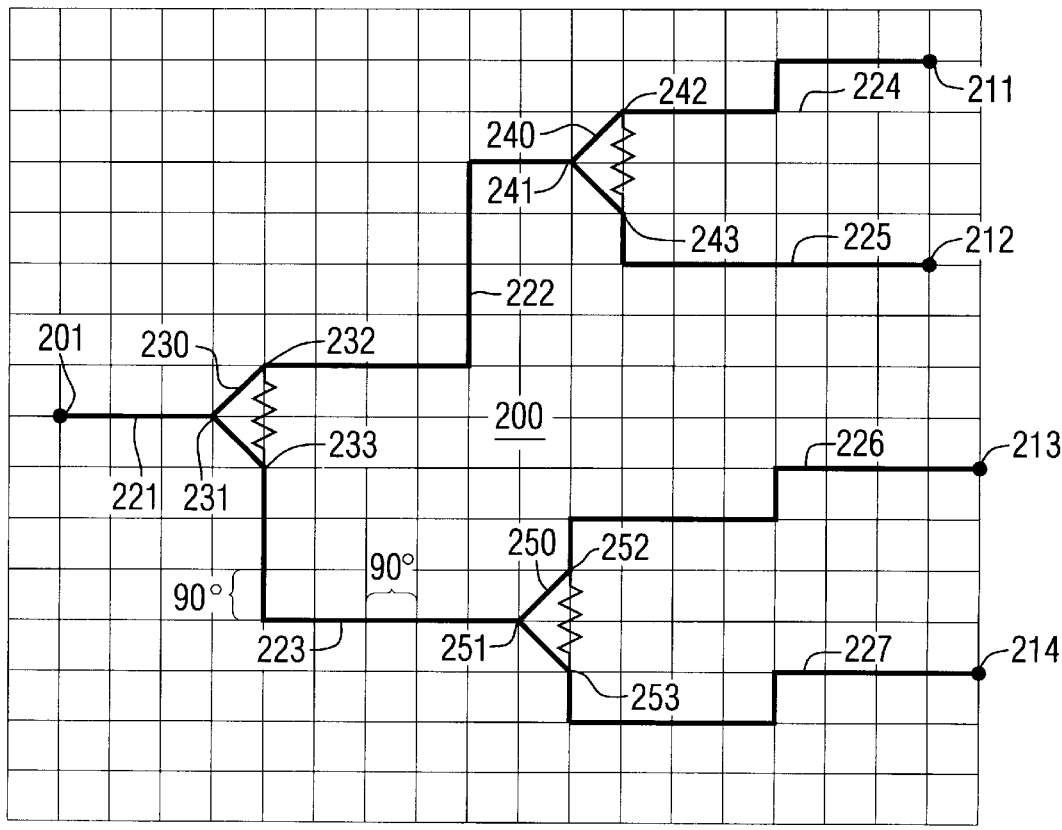
FIG. 8 is a diagrammatic plan view of a four-way power divider different from that shown in FIG. 7.

This cross-over placement relationship may be understood by reference to the diagrammatic plan view of FIG. 6, which shows a pair of mutually overlapping four-way power dividers 100 and 200, that are shown individually in the plan views of FIGS. 7 and 8, respectively. Each plan diagram is shown as being laid out on a rectangular grid, with the separation between adjacent grid lines associated with an electrical distance of ninety degrees.

In particular, FIG. 7 (and likewise the mutually overlapping plan view of FIG. 6) shows a first (four-way) power divider 100, having an input port 101 to which a first signal of interest is supplied, and a plurality of (four) output ports 111,112,113,114, from which a first plurality of (four) output signals corresponding to four-way divided versions of the first signal are derived. Similarly, FIG. 8 (and likewise the mutually overlapping plan view of FIG. 6) shows a second four-way power divider 200 having an input port 201, to which a second signal is supplied, and a plurality of (four) output ports 211,212,213,214, from which a plurality of (four) output signals corresponding to (four-way) divided versions of the second signal are to be derived.

The four-way power divider 100 of FIG. 7 and that of FIG. 6 includes a stripline signal distribution network coupled between the input port 101 and the output ports 111,112,113,114, and configured to divide the first signal into four output signals at output the ports 111,112,113,114. For this purpose, power divider network 100 has a first power divider 130, shown as a Wilkinson splitter, having an input port 131 coupled to the input port 101 through a first section of stripline 121. Wilkinson splitter 130 has first and second output ports 132 and 133, from which (−3 dB) split versions of the signal applied to port 131 are derived. To provide a four-way division of the signal at port 101, this pair of split signals is further coupled to second and third power dividers 140 and 150, also shown as Wilkinson splitters.

Wilkinson splitter 140 has an input port 141 coupled to the output port 132 of power divider 130 through a second section of stripline 122, while Wilkinson splitter 150 has an input port 151 coupled to the output port 133 of power divider 130 through a third section of 90° stripline 123. Wilkinson splitter 140 has first and second output ports 142 and 143, from which (−3 dB) split versions of the signal applied to its input port 141 are derived. To provide a first half of the four-way division of the signal at port 101, the output port 142 of Wilkinson splitter 140 is coupled via a fourth section of stripline 124 to the first output port 111, and output port 143 is coupled via a fifth section of stripline 125 to the second output port 112. Similarly, Wilkinson splitter 150 has first and second output ports 152 and 153, from which (−3 dB) split versions of the signal applied to its input port 151 are derived. To provide a second half of the four-way division of the signal at port 101, the output port 152 of Wilkinson splitter 150 is coupled via a sixth section of stripline 126 to the third output port 113, and output port 153 is coupled via a seventh section of stripline 127 to the fourth output port 114.

The four-way power divider 200 of FIG. 8 and that of FIG. 7 includes a stripline signal distribution network coupled between input port 201 and output ports 211,212, 213,214, and configured to divide the second signal into four output signals at output the ports 211,212,213,214. Similarly to the power divider network 100 of FIG. 7, power divider network 200 has a first Wilkinson splitter power divider 230, having an input port 231 coupled to input port 201 through a first section of stripline 221. Wilkinson splitter 230 has first and second output ports 232 and 233, from which (−3 dB) split versions of the signal applied to port 231 are derived. To provide a four-way division of the signal at port 201, this pair of split signals is further coupled to second and third Wilkinson splitter power dividers 240 and 250.

Wilkinson splitter 240 has an input port 241 coupled to the output port 232 of power divider 230 through a second section of stripline 222, while Wilkinson splitter 250 has an input port 251 coupled to the output port 233 of power divider 230 through a third section of 90° stripline 223. Wilkinson splitter 240 has first and second (−3 dB) output ports 242 and 243, from which split versions of the signal applied to input port 241 are derived. The output port 242 of Wilkinson splitter 240 is coupled via a fourth section of stripline 224 to the first output port 211, and output port 243 is coupled via a fifth section of stripline 225 to the second output port 212. Similarly, Wilkinson splitter 250 has first and second output (−3 dB) ports 252 and 253, from which split versions of the signal applied to its input port 251 are derived. The output port 252 of Wilkinson splitter 250 is coupled via a sixth section of stripline 226 to the third output port 213, and output port 253 is coupled via a seventh section of stripline 227 to the fourth output port 214.

From an examination of FIG. 6, it can be seen that overlaying the four way power divider 100 of FIG. 7 with the four way power divider 200 of FIG. 8, so that their output ports are alternatively interleaved with one another, will cause the two networks to cross over one another or mutually overlap at three locations 301, 302 and 303, where portions of the input signal of one ('coupled-from') network will be cross-coupled into the other ('coupled-to') network. As pointed out previously, each cross-coupling location will give rise to a potential signal degradation problem, since the cross-coupled signals will appear at one or more output ports of the other network, where they may interfere with the desired signals at the output ports of the one network.

For the example of FIG. 6, at the first cross-over location 301, the third section of stripline 123 of the power divider network 100 overlaps the second section of stripline 222 of the power divider network 200, so that a portion (e.g., −15 dB) of the (−3 dB) split signal (applied to input port 101) in stripline section 123 of the power divider network 100 is coupled into the second stripline section 222 of power divider network 200. At the second cross-over location 302, the fifth section of stripline 125 of the power divider network 100 overlaps the fourth section of stripline 224 of the power divider network 200, so that a further portion (e.g., −15 dB) of the (−6 dB) split signal in the fifth stripline section 125 is coupled into the fourth stripline section 224 of power divider network 200, and transported thereby to the first output port 211 of power divider 200.

Since the fourth stripline section 224 of power divider network 200 is coupled to (−3 dB split from) the second stripline section 222 via the Wilkinson splitter 240, the first output port 211 will manifest both the first and second cross-coupled portions of the signal applied to input port 101 of power divider network 100, and cross coupled to the power divider network 200 at the first and second cross overs 301 and 302, respectively. In addition, since the fifth stripline section 225 of the power divider network 200 is coupled to the second output port 243 of the Wilkinson splitter 240, the second output port 212 will manifest the first cross-coupled portion of the signal applied to input port 101 of power divider network 100 and cross coupled to power divider network 200 at cross over 301.

At the third cross-over location 303, the seventh section of stripline 127 of the power divider network 100 overlaps the sixth section of stripline 226 of the power divider network 200, so that a further portion (e.g., −15 dB) of the (−6 dB) split signal in stripline section 127 of the power divider network 100 is coupled into the sixth stripline section 226 of the power divider network 200. This further cross coupled portion of the input signal applied to input port 101 of power divider 100 is manifested at output port 213 of power divider network 200.

Thus, as a result of the three cross-overs 301, 302 and 303, there is the potential for portions of the signal applied to input port 101 of the power divider network 100 being manifested at each of output ports 211, 212 and 213 of power divider 200, and thereby interfering with the signals produced at the output ports 111,112,113,114 of the power divider 100. As pointed out above, pursuant to the present invention, this potential problem is effectively circumvented by defining the geometry of the networks and locating the crossovers such that the electrical distance to downstream signal combination locations will cause unwanted signals that have been mutually coupled between stripline layers to effectively cancel one another, when the desired signals through the layer are combined in phase.

In the composite stripline layout of FIG. 6, this is achieved by selectively contouring each respective stripline section relative to any cross-over point therealong, and/or adjusting the locations of respective cross-over points, as necessary to achieve the requisite electrical lengths. Applying 90° per grid unit dimensions to the composite network shown in FIG. 6 yields amplitude (A) and phase (Φ) values in respective stripline sections 222, 224 and 226, of the power divider 200 (relative to the signal at input port 101 of power divider 100) for the cross-over points 301, 302 and 303 as follows.

At cross-over point 301: $A_{222}$=−18 dB; $\Phi_{222}$=180°.

At cross-over point 302: (−21 dB at $\Phi$=1080°)+(−21 dB at $\Phi$=900°)=>$A_{224}$=−∞ dB; $\Phi_{224}$=0°.

At cross-over point 303: $A_{226}$=−21 dB; $\Phi_{226}$=900°.

Since cross-over point 302 is coupled (via stripline section 222) to the first output port 211 of power divider 200, the contribution of the input signal at port 101 of power divider 100 to the first output port 211 of power divider 200 is zero. On the other hand, the cross-coupling of the signal applied to the input port 101 of network 100 into the stripline section 222 of the network 200 at cross-over point 301 is injected into the fifth stripline section 225 of the power divider network 200 at the second output port 243 of the Wilkinson splitter 240. This cross-coupled signal is manifested at the second output port 212 of the power divider 200 with the parameters $A_{212}$=−21 dB; $\Phi_{212}$=1710°.

Also, the cross-coupling of the signal applied to the input port 101 of network 100 into the stripline section 226 of the power divider network 200 is manifested at the third output port 213 of the power divider 200 with the parameters $A_{213}$=−21 dB; $\Phi_{213}$=1530°. Since the signal propagation path from the input port 201 of the power divider 200 to its fourth output port 214 encounters no cross-over with the power divider network 100, the contribution of the input signal applied to input port 101 of power divider 100 to the fourth output port 214 of power divider 200 is zero.

Summing these four contributions of the signal applied to input port 101 of power divider 100 at output ports 211–214 of power divider 200 yields $(0)_{211}+(A_{212}=-21$ dB; $\Phi_{212}=1710°)+(A_{213}=-21$ dB; $\Phi_{213}=1530°)+(0)_{214}=A_\Sigma=-\infty$ dB; $\Phi_\Sigma=0°$.

It should also be noted that establishing the stripline layout geometry and cross-over locations shown in FIG. 6 and described above is not only effective to ensure that the electrical distance to downstream signal combination locations will cancel signals mutually coupled from power divider 100 to stripline layers of power divider 200, but will also cancel signals mutually coupled from power divider 200 to stripline layers of power divider 100.

More particularly, again applying 90° per grid unit dimensions to the composite network shown in FIG. 6 yields amplitude (A) and phase ($\Phi$) values in respective stripline sections 123, 125 and 127 of the power divider 100 (relative to the signal at input port 201 of power divider 200) for the cross-over points 301, 302 and 303 as follows.

At cross-over point 301: $A_{123}=-18$ dB; $\Phi_{123}=360°$.

At cross-over point 302: $A_{125}=-21$ dB; $\Phi_{125}=1260°$.

At cross-over point 303: $(-21$ dB at $\Phi=1260°)+(-21$ dB at $\Phi=1080°)=>A_{127}=-\infty$ dB; $\Phi_{127}=0°$.

Since the signal propagation path from the input port 101 of the power divider 100 to its first output port 111 encounters no cross-over with the power divider network 100, the contribution of the input signal applied to input port 201 of power divider 200 to the first output port 111 of power divider 100 is zero. On the other hand, the cross-coupling of the signal applied to the input port 201 of power divider 200 via cross-over point 302 into the stripline section 125 of the power divider network 100 is manifested at the second output port 112 of the power divider 100 with the parameters $A_{112}=-21$ dB; $\Phi_{112}=1890°$.

Similarly, the cross-coupling of the signal applied to the input port 201 of power divider 200 into the stripline section 123 of the power divider network 100 at cross-over point 301 is injected into the sixth stripline section 126 of the power divider network 100 at the first output port of the Wilkinson splitter 150. This cross-coupled signal is manifested at the third output port 113 of the power divider 100 with the parameters $A_{113}=-21$ dB; $\Phi_{113}=1710°$. Since cross-over point 303 is coupled (via stripline section 127) to the fourth output port 114 of power divider 100, the contribution of the input signal at port 201 of power divider 200 to the fourth output port 114 of power divider 100 is zero.

Summing these four contributions of the signal applied to input port 201 of power divider 200 at output ports 111–114 of power divider 100 yields $(0)_{111}+(A_{112}=-21$ dB; $\Phi_{112}=1890°)+(A_{113}-21$ dB; $\Phi_{113}=1710°)+(0)_{114}=>A_\Sigma=-\infty$ dB; $\Phi_\Sigma=0°$.

As will be appreciated from the foregoing description, by properly defining the geometry of, and locating each of the points at which mutually overlapping adjacent stripline networks cross one another, unwanted (cross-coupled) signals will eventually cancel one another, when the desired signals are combined in phase, thereby effectively preventing mutual interference between adjacent layers of stripline. This a priori locating of the stripline cross-over points is particularly beneficial in a multilayer signal distribution architecture configured to distribute signals with respect to elements of adjacent phased array antennas, as it obviates the need for an additional dielectric layer and an additional grounded shielding layer, thereby reducing the size, weight and cost of the multilayer architecture.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A signal coupling network comprising:
   a first signal propagation network coupled between a first signal input port and a plurality of first signal output ports; and
   a second signal propagation network coupled between a second signal input port and a plurality of second signal output ports, and being spaced apart from said first second signal propagation network by dielectric material therebetween, and crossing over said first signal propagation network at a plurality of cross-overs of mutual overlap therebetween; and wherein
   signals conveyed by said first and second propagation network are cross-coupled therebetween at said plurality of cross-overs, and wherein said cross-overs are located such that electrical distances between said plurality of cross-overs and downstream signal combination locations cause cross-coupled signals to cancel one another, when non cross-coupled signals are combined in phase.

2. A signal coupling network according to claim 1, wherein, at said plurality of cross-overs, respective conductors of said first and second signal propagation networks are spatially oriented at right angles to one another.

3. A signal coupling network according to claim 1, wherein said signal coupling network is exclusive of a shielding layer between said first and second signal propagation networks.

4. A signal coupling network according to claim 1, further including tuning stubs spaced apart by a quarter wavelength from said plurality of cross-overs of said first and second signal propagation networks.

5. A stripline cross-over architecture comprising:
   a dielectric layer;
   a first stripline layer extending on a first side of said dielectric layer between a first signal input port and a plurality of first signal output ports;
   a second stripline layer extending on a second side of said dielectric layer between a second signal input port and a plurality of second signal output ports and crossing over said first stripline layer at a plurality of cross-overs of mutual overlap therebetween; and wherein
   signals conveyed by said first and second stripline layers are cross-coupled therebetween at said plurality of cross-overs, and wherein said plurality of cross-overs are located such that electrical distances between said plurality cross-overs and downstream signal combination locations cause cross-coupled signals to cancel one another, when non cross-coupled signals are combined in phase.

6. A stripline cross-over architecture according to claim 5, wherein, at said plurality of cross-overs, said first and second stripline layers are spatially oriented at right angles to one another.

7. A stripline cross-over architecture according to claim 5, wherein said stripline cross-over architecture is exclusive of a shielding layer between said first and second stripline layers.

8. A stripline cross-over architecture according to claim 5, further including tuning stubs spaced apart by a quarter wavelength from said plurality of cross-overs of said first and second stripline layers.

9. A method of preventing signals respectively propagating through first and second signal propagation networks of a signal coupling network from mutually interfering with one another, said signal coupling network having said first signal propagation network coupled between a first signal input port and a plurality of first signal output ports, and said second signal propagation network coupled between a second signal input port and a plurality of second signal output ports, and being spaced apart from said first second signal propagation network by dielectric material therebetween, and crossing over said first signal propagation network at a plurality of cross-overs of mutual overlap therebetween, such that signals conveyed by said first and second signal propagation networks are cross-coupled therebetween at said plurality of cross-overs, said method comprising the steps of:

(a) setting effective electrical lengths of respective conductors of said first and second signal propagation networks and locations of said plurality of cross-overs in accordance with a prescribed signal processing relationship; and (b) establishing said prescribed signal propagation signal processing relationship such that electrical distances between said plurality of cross-overs and downstream signal combination locations of signals propagating through said first and second signal propagation networks cause cross-coupled signals to cancel one another, when non cross-coupled signals are combined in phase, thereby effectively preventing mutual interference between said first and second signal propagation networks.

10. A method according to claim 9, wherein step (a) comprises spatially orienting conductors of said first and second signal propagation networks at right angles to one another at said plurality of cross-overs.

11. A method according to claim 9, wherein step (a) further comprises providing tuning stubs spaced apart by a quarter wavelength from said plurality of cross-overs of said first and second signal propagation networks.

* * * * *